United States Patent [19]
Shastri et al.

[11] Patent Number: 5,844,928
[45] Date of Patent: Dec. 1, 1998

[54] LASER DRIVER WITH TEMPERATURE SENSOR ON AN INTEGRATED CIRCUIT

[75] Inventors: Kalpendu Ranjitrai Shastri, Allentown; David Alan Snyder, Springfield Township, Bucks County, both of Pa.

[73] Assignee: Lucent Technologies, Inc., Murray Hill, N.J.

[21] Appl. No.: 803,405

[22] Filed: Feb. 20, 1997

Related U.S. Application Data

[60] Provisional application No. 60/012,378 Feb. 27, 1996.

[51] Int. Cl.[6] .................................................. H01S 3/102
[52] U.S. Cl. ............................................. 372/38; 372/34
[58] Field of Search ............................ 372/9, 29, 31–34, 372/38

[56] References Cited

U.S. PATENT DOCUMENTS

| | | | |
|---|---|---|---|
| 4,710,631 | 12/1987 | Aotsuka et al. | 250/354.1 |
| 5,019,769 | 5/1991 | Levinson | 372/31 |
| 5,043,992 | 8/1991 | Royer et al. | 372/38 |
| 5,278,404 | 1/1994 | Yeates et al. | 250/214 |
| 5,334,826 | 8/1994 | Sato et al. | 372/29 X |
| 5,337,254 | 8/1994 | Knee et al. | 364/489 |
| 5,396,059 | 3/1995 | Yeates | 250/214 |
| 5,625,616 | 4/1997 | Koike et al. | 372/33 X |

FOREIGN PATENT DOCUMENTS

| | | | |
|---|---|---|---|
| 0 421 674 A2 | 9/1990 | European Pat. Off. | H01S 3/096 |
| 0 421 674 A3 | 9/1990 | European Pat. Off. | H01S 3/096 |
| 0 431 832 A3 | 11/1990 | European Pat. Off. | H02H 5/04 |
| 60-251731 A | 12/1985 | Japan | H04B 9/00 |
| 02-020084 A | 1/1990 | Japan | H04B 9/00 |

*Primary Examiner*—John D. Lee

[57] ABSTRACT

There is disclosed a laser driver or transmitter in which a drive current is generated by monitoring the temperature of an integrated circuit that generates drive current for the laser. The temperature sensed at the integrated circuit is transformed to a corresponding temperature at the laser. A drive current is generated for the laser that is dependent on the corresponding temperature at the laser.

8 Claims, 2 Drawing Sheets

LASER DRIVER WITH TEMPERATURE SENSOR ON AN INTEGRATED CIRCUIT

This application claims benefit of Provisional application Ser. No. 60/012,378 filed Feb. 27, 1996.

TECHNICAL FIELD

This invention relates generally to laser drivers or transmitters, and particularly to laser drivers having temperature compensation.

BACKGROUND OF THE INVENTION

The optical output (light) of a laser diode or laser is a nonlinear function of the current driving the laser. The light-current characteristic of a laser is also temperature dependent. The minimum driving current that causes the laser to operate in a lasing mode is known as the threshold current. Over the temperature operating range of a laser, higher operating temperatures require higher threshold currents to cause the laser to operate in a lasing mode. Correspondingly, lower operating temperatures require smaller threshold currents to cause the laser to operate in a lasing mode. The threshold current is a function of the operating temperature of the laser and may vary as much as an order of magnitude over the temperature operating range of the laser.

Integrated circuits are employed to modulate data onto the laser output. The laser is turned on and off by a driving current commensurate with the data to be modulated. The driving current is generally comprised of two components, a bias current that maintains the laser at the edge of operating in the lasing mode and a modulation current. The bias current has been controlled to be the threshold current of the laser. Since a laser will not operate in the lasing mode until the threshold current has been reached (or exceeded) it is important that the bias current be controlled precisely to be the threshold current at the temperature at which the laser is operating. Should the bias current fall below the threshold current, an unacceptable laser turn-on delay occurs. A turn-on delay is particularly undesirable when the laser operates at high switching speeds. A bias current higher than the threshold current is also undesirable because an extinction ratio problem is introduced into the laser output. An extinction ratio problem occurs when the light emitted by the laser should decrease to zero, and not be offset from zero, when the modulation current component of the laser drive circuit is zero, however the light emitted by the laser does not decrease to zero due to the bias current being higher than the threshold current. It is thus desirable to maintain the bias current precisely at the threshold current level for the temperature at which the laser is operating.

In one known bias current control technique, such as disclosed in U.S. Pat. No. 5,019,769, a laser and backface diode are mounted on a thermoelectric cooler. The thermoelectric cooler maintains the laser operating temperature at a controlled set point. A laser temperature sensor, also mounted on the thermoelectric cooler, senses the temperature of the thermoelectric cooler which is the same temperature as the operating temperature of the laser. A laser controller employs a programmed microcontroller to sense the laser temperature, control the thermoelectric cooler (and hence the laser temperature), and control the process of turning on and selecting the operating point of the laser. Using a thermoelectric coder introduces additional cost and requires more complex controls.

In another known technique, a temperature compensating circuit is mounted in thermal contact with the laser. A temperature compensating circuit produces a current component for driving the laser that is proportional to the operating temperature of the laser. This technique varies the laser drive current to compensate for temperature variations, without the need for a thermoelectric cooler.

SUMMARY OF THE INVENTION

In accordance with the present invention, a drive current for a laser driver is generated by monitoring the temperature of an integrated circuit that generates drive current for the laser. The temperature sensed at the integrated circuit is transformed to a corresponding temperature at the laser. A drive current is generated for the laser that is dependent on the corresponding temperature at the laser.

BRIEF DESCRIPTION OF THE DRAWINGS

The invention will be described by way of example in which.

DETAILED DESCRIPTION

Figure 1:
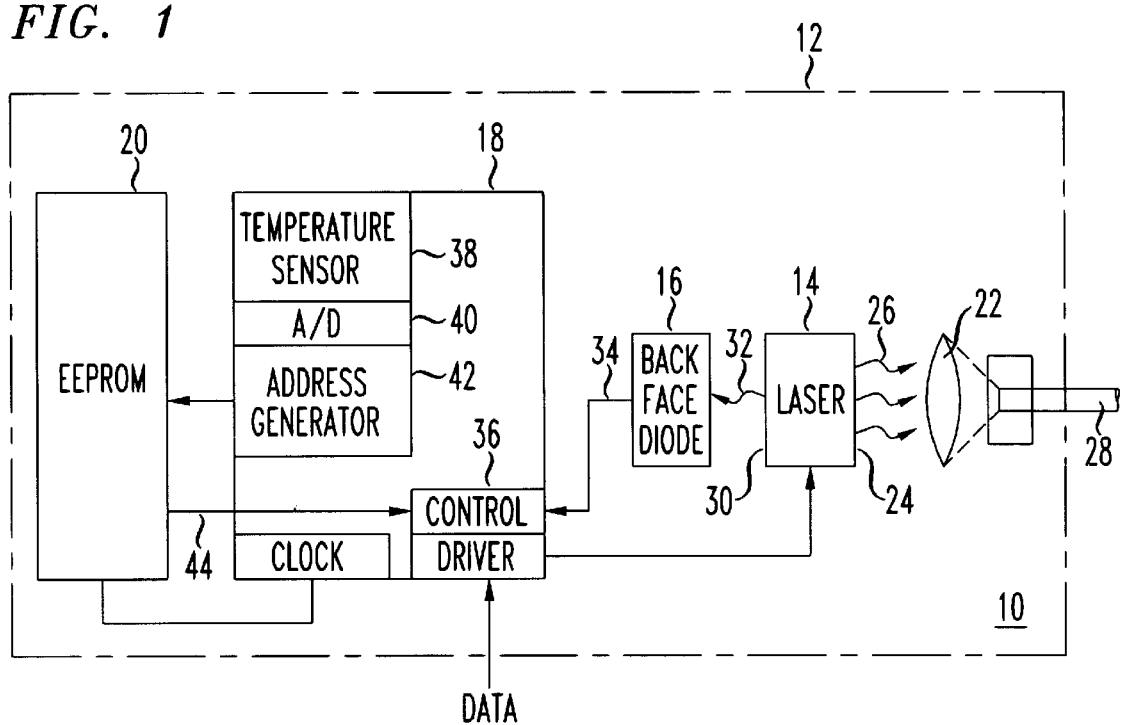
FIG. 1 is a block diagram illustration of a laser package, including control electronics, in accordance with the present invention.

An illustrative embodiment of a laser driver 10 in accordance with the present invention is shown in FIG. 1. Laser driver 10 is enclosed in a package 12 which is represented symbolically. Laser driver 10 includes a laser 14, a backface diode 16, an integrated circuit 18 providing a multiplicity of functions, and a look-up table 20 such as an electrically erasable programmable read only memory (EEPROM). A remotely sensed temperature at integrated circuit 18 is translated through data stored in look-up table 20 to a corresponding temperature at laser 14, and laser 14 is controlled in response to the corresponding temperature at the laser. Laser driver 10 may also include a lens 22 for focusing light emitted by laser 14.

Laser 14 has a front facet 24 from which coherent light 26 is emitted. The coherent light, which may be passed through lens 22, is passed into a fiber 28 for transmission. A small portion of the light emitted from laser 14 is emitted from rear facet 30. A portion 32 of the light emitted from rear facet 30 impinges on backface diode 16. Since the optical power output from front facet 24 of laser 14 is proportional to the optical power output from rear facet 30, backface diode 16 continuously monitors the optical power output by laser 14. The optical power output by laser 14 can be correlated to heat generated by laser 14. Backface diode 16 provides a signal, such as a current, over a conductor 34 to the control portion 36 of integrated circuit 18.

The temperature within package 12 has local variations. There is not a single temperature within package 12. Some components generate or dissipate more heat than other components, and some regions of the package may dissipate heat transferred to it from heat generating components more readily than other regions of the package. In accordance with the present invention, a temperature is measured on an integrated circuit 18 within package 12 of laser driver 10, remotely relative to laser 14. Thus, the temperature of laser 14 is not measured. The measured temperature may be less than or greater than the temperature of laser 14. Typically, the measured temperature will be lower than the temperature of laser 14. The temperature is measured by a temperature sensor 38 on integrated circuit 18, such as a temperature sensitive circuit, varying a temperature sensitive parameter. The temperature sensitive parameter either is or creates a temperature sensitive signal. In the illustrative embodiment, the temperature sensitive signal is converted from an analog form to a digital form in analog-to-digital converter 40 on integrated circuit 18, which in turn is converted by address generator 42 to a corresponding address. The address so generated is used to access look-up table 20 to retrieve data stored at that address relative to operation of laser driver 10 at a corresponding temperature. Also retrieved may be other data such as back face monitor setpoint, the value at which to limit current to the laser should it fail which is the extremum aging coefficient or current. The aging coefficient is ratio of the actual laser threshold current, at a given temperature, to the beginning-of-life threshold current at the same temperature. This data may represent multiple channels 44 of data. The data stored in look-up table 20 is predetermined from a model described below with respect to FIG. 4. The measured temperature is a temperature on integrated circuit 18 that corresponds to an operating temperature of laser 14. The data predetermined and stored in look-up table 20 is based on the temperature at the laser corresponding to the measured temperature.

The data retrieved from look-up table 20 over channels 44 is provided to control 36 and may include a digital representation of the backface diode current set point 46, a digital representation of the desired bias and modulation currents 48 and 50 at the measured temperature, and maximum allowed aging coefficient 52. The current signal generated by backface diode 16 is digitized by analog-to-digital converter 54 for comparison in comparator 56 to the digital representation of the backface diode current set point 46 retrieved from look-up table 20. If the digital representation of the current signal is greater than the backface diode set point 46, a feedback loop operates in that up-down counter 58 counts down. This correction is used to multiply, in multipliers 62 and 64, the bias current 48 and modulation current 50 retrieved from look-up table 20. This reduces the drive current to laser 14, interalia, reducing the portion of light 32 emitted from rear facet 30. This feedback loop eliminates the difference between set point 46 and the digital representation of the backface diode output. The counter output, when multiplied with the digital representation of the bias current, results in a modified bias current 48' that is provided to driver 43, which in turn generates the drive current to drive laser 14. If the digital representation of the current signal from backface diode 16 is less than the backface diode set point 46, the feedback loop operates in that up-down counter 58 counts up, as limited by maximum aging coefficient 52 in upper limit 68, increasing its output to driver 43, which increases the drive current to laser 14 and in turn increases the portion of light 32 emitted from rear facet 30. Again, operation of the feedback loop eliminates the difference between set point 46 and the digital representation of the backface diode output.

Figure 2:
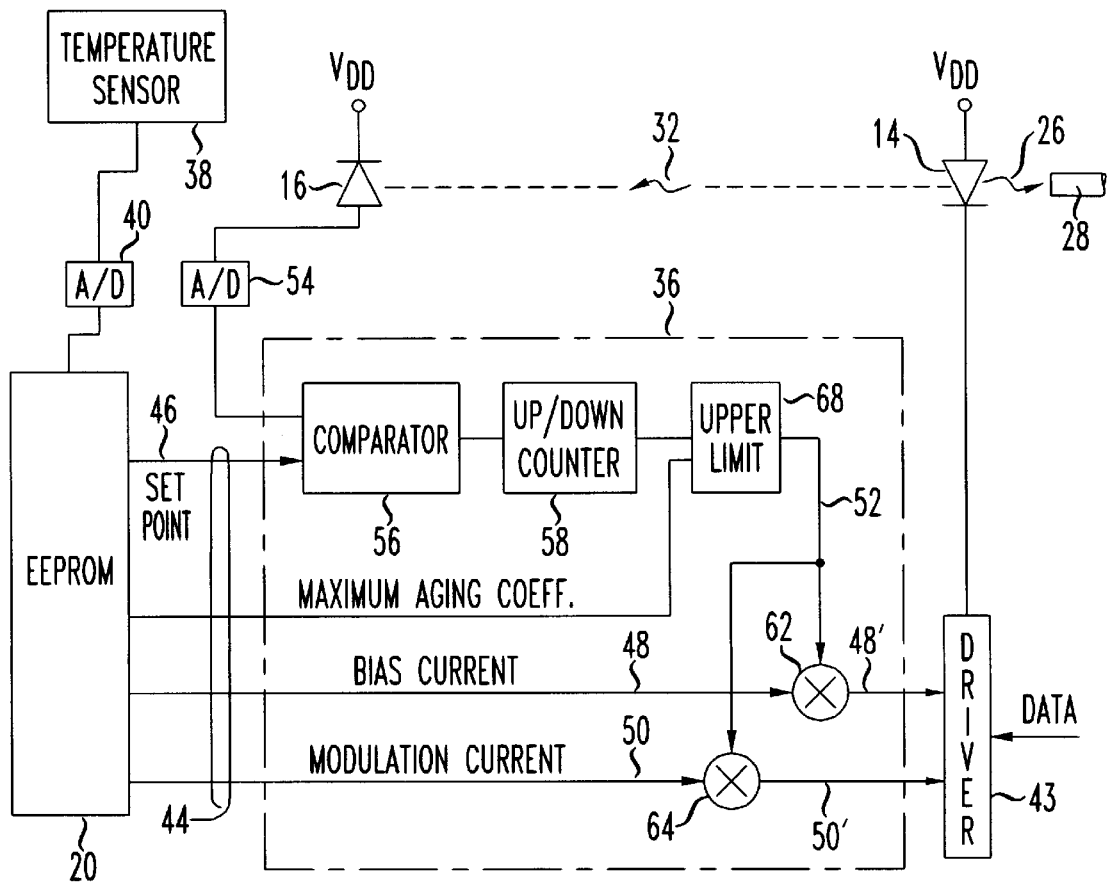
FIG. 2 is a schematic diagram of a portion of the control electronics in the block diagram of FIG. 1.

If appropriate, modulation current 50 for the sensed temperature is also retrieved from look-up table 20. As shown in FIG. 2, either or both of the bias current 48 and modulation current 50 can be modified, such as by multiplication factors M1 and M2 respectively, in multipliers 62 and 64. The age compensated digital representation of bias current is designated 48'. The age compensated digital representation of modulation current is designated 50'. Note that when factors M1 and M2 are set to 1, unmodified bias current 48 and modulation current 50 are provided to driver 43. The digital representations of bias current 48' and the digital representation of modulation current 50' are provided driver 43 to be converted to an analog current signal to drive laser 14. Data to modulate the operation of laser 14 is also provided to driver 43. The data is used by driver 43 to switch on and off the modulation current.

Upon power-up of laser driver 10, with the feedback loop turned off, configuration information is downloaded from look-up table 20. This is done since the same integrated circuit and look-up table can be used for various configurations in the physical packaging of laser driver 10. The predetermined digital representations of drive current stored in the look-up table are unique to the package and components in the package. The temperature is sensed by temperature sensor 38 and once the temperature is sensed and the various analog-to-digital and digital-to-analog converters settle, the feedback loop is turned on to control operation of laser driver 10.

Figure 3:
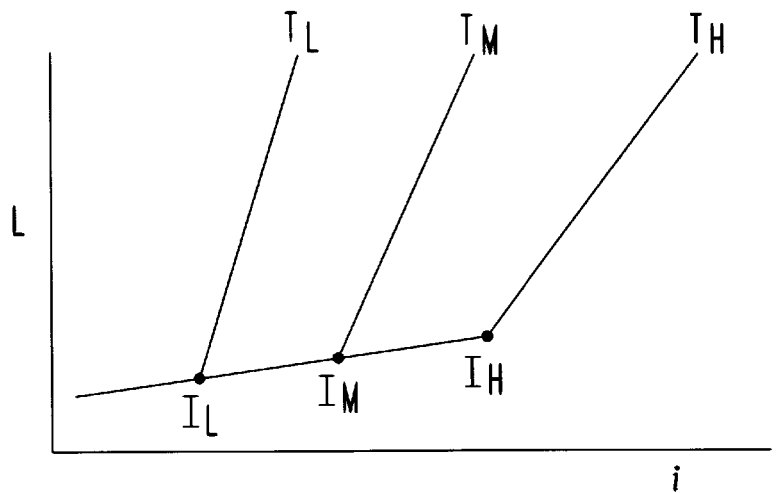
FIG. 3 is a graphical illustration of the optical output of a laser, L, for a given drive current, i, at three temperatures over the operating temperature range of a laser.

The optical output, L, of a laser is a nonlinear function of the forward bias and modulation currents, or drive current, of the laser as shown in FIG. 3. When drive current is applied to a laser, the laser does not commence lasing operation until the drive current reaches a minimum, known as the threshold current. The threshold current varies among lasers, with laser aging, and as seen in FIG. 3, also varies with temperature. FIG. 3 illustrates graphically the threshold current variation with temperature of the laser being driven, as well as how the drive current is temperature dependent. The drive current is illustrated for three temperatures, a low temperature $T_L$, medium temperature $T_M$ and high temperature $T_H$, over the operating range of the laser. The threshold current for each of the low, medium, and high temperature ranges is shown as $I_L$, $I_M$, and $I_H$, respectively.

Figure 4:
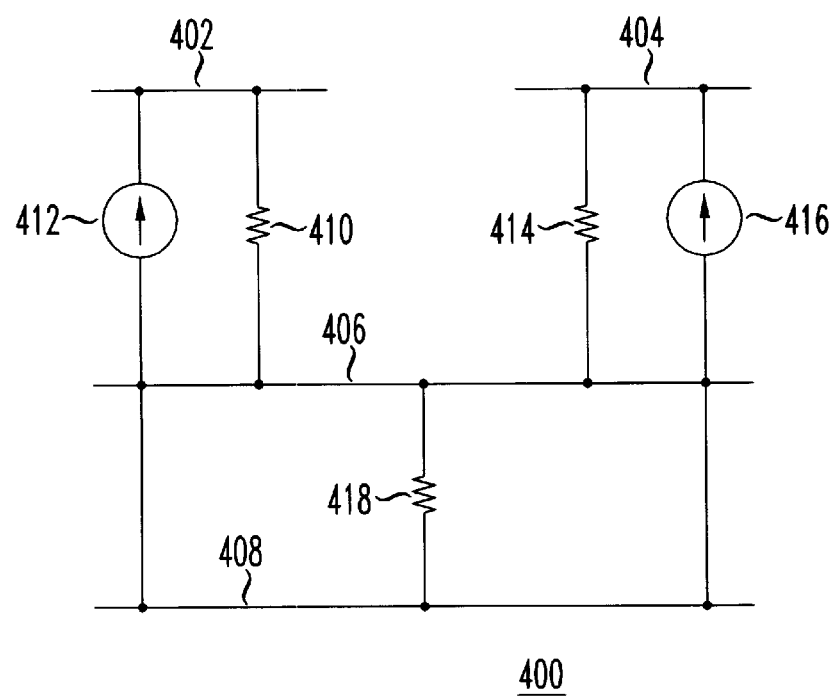
FIG. 4 is a electrical representation of a thermodynamic model of a laser transmitter package that may be used to analytically determine, from a temperature at the integrated circuit, a corresponding temperature at the laser over the operating temperature range of the laser.

A thermal model is shown in FIG. 4 that may be used to analytically evaluate the temperature of the laser based on the temperature sensed by temperature sensor 38 on integrated circuit 18. FIG. 4 represents a thermal model 400 of laser driver 10. Node 402 represents the temperature measured at the integrated circuit 18, temperature sensor 38. Node 404 represents the temperature at laser 14. Node 406 represents the temperature at the housing or case in which the laser and integrated circuit are packaged. Node 408 represents the ambient, an infinite reservoir for heat dissipation. Thermal resistance 410 represents the thermal resistance between heat generated in integrated circuit 18 and the housing or case in which the laser and integrated circuit are packaged. Current generator 412 represents the heat generated by the drive circuit, which is a function of the drive current provided to the laser. Thermal resistance 414 represents the thermal resistance between heat generated in the laser and the housing or case in which the laser and integrated circuit are packaged. Current generator 416 represents heat generated at laser 14, which is a function of the laser drive current. Thermal resistance 418 represents a thermal resistance between the case or housing and the surrounding ambient.

By varying parameters in model 400, the thermal characteristics of laser driver 10 can be modeled to determine the appropriate laser drive current for measured temperatures at integrated circuit 18 under the modeled conditions. While a more complex thermal model could be employed, applicants have found this model to suffice. Model 400 is versatile and can accommodate many variations in locating the integrated circuit and laser relative to each other, various packaging materials and shapes, as well as environmental factors such as ambient air or forced air environment.

The model equations may be solved in any known manner by one skilled in the art. Solving the model equations may be recursive until a solution converges, as is known in the art.

While the invention has been described as measuring the temperature of an integrated circuit that generates drive current for a laser and converting the temperature of the integrated circuit to a corresponding temperature at the laser and generating a drive current for the laser that is a function of the corresponding temperature at the laser, it should be readily recognized that once the relationship between the temperature of the integrated circuit and the corresponding temperature at the laser is determined, it is not necessary to generate the actual temperature at the laser. In this manner, it is contemplated that it is not necessary to generate the actual temperature at the laser but rather be able to generate a drive current for the laser that is a function of the temperature at the laser.

While the invention has been described as predetermining a plurality of discrete drive currents over a range of corresponding laser temperatures, which suggests a digital implementation, it is recognized that the invention could be implemented in a total analog capability.

While the invention has been described as predetermining digital representations of the bias and modulation current data for the look-up table using a thermal model, alternatively the digital representations of the bias and modulation current data could be determined by empirical testing.

While the maximum aging current has been disclosed as limiting the output of an up-down counter when counting up, the invention is not limited thereto. Other techniques of implementing the aging coefficient are contemplated within the scope of the invention.

The invention claimed is:

1. A method of generating a drive current for a laser, comprising the steps of:

monitoring the temperature of an integrated circuit that generates drive current for a laser, the integrated circuit remotely located with respect to said laser;

converting the temperature of the integrated circuit to a corresponding temperature at the laser; and generating a drive current for the laser that is a function of the corresponding temperature at the laser.

2. The method as recited in claim 1, wherein the converting step comprises entering a look-up table with a representation of the integrated circuit temperature to obtain the corresponding temperature at the laser.

3. The method as recited in claim 1, wherein the generating step comprises:

predetermining a plurality of discrete drive currents over a range of corresponding laser temperatures; and storing a digital representation of the plurality of discrete drive currents in a look-up table.

4. The method as recited in claim 3, further comprising the steps of:

entering the look-up table based on a temperature of the integrated circuit; and retrieving from the look-up table a digital representation of one of the plurality of drive currents that correlates to the temperature of the integrated circuit.

5. A laser transmitter, comprising a laser for receiving a drive current and for emitting light in response thereto;

an integrated circuit for generating the drive current for the laser and remotely located with respect to said laser, the integrated circuit comprising a temperature sensing circuit that senses the temperature of the integrated circuit, the integrated circuit converting the temperature at the integrated circuit to a representation corresponding to the temperature at the laser;

a look-up table for receiving the representation corresponding to the temperature at the laser and for generating a representation of a corresponding drive current; and a driver for converting the representation of the drive current into a drive current, the drive current provided to the laser.

6. The laser transmitter as recited in claim 5, wherein the look-up table is stored in an electrically erasable programmable read only memory.

7. The laser transmitter as recited in claim 5, wherein the representation of the corresponding drive current is a digital representation.

8. The laser transmitter as recited in claim 7, wherein the driver is a digital-to-analog converter.

* * * * *